United States Patent
Reining

(10) Patent No.: US 8,855,187 B2
(45) Date of Patent: Oct. 7, 2014

(54) SIGNAL PROCESSING METHOD FOR ENHANCING A DYNAMIC RANGE OF A SIGNAL

(75) Inventor: Friedrich Reining, Vienna (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/346,031

(22) Filed: Jan. 9, 2012

(65) Prior Publication Data
US 2012/0177099 A1  Jul. 12, 2012

(30) Foreign Application Priority Data

Jan. 12, 2011 (EP) ..................................... 11150750

(51) Int. Cl.
  *H03K 7/04* (2006.01)
  *H03K 7/06* (2006.01)
  *H03K 9/04* (2006.01)
  *H03K 9/06* (2006.01)
  *H03G 7/00* (2006.01)
  *H04R 3/00* (2006.01)

(52) U.S. Cl.
  CPC . *H04R 3/00* (2013.01); *H03G 7/007* (2013.01)
  USPC .......... 375/239; 375/295; 375/242; 375/340; 381/107; 381/120; 381/174; 381/94.1

(58) Field of Classification Search
  CPC .......... H03G 7/007; H03G 9/005; H04R 3/00
  USPC ......... 375/130–377; 348/14–844; 341/1–899; 381/1–433
  See application file for complete search history.

(56) References Cited

U.S. PATENT DOCUMENTS

| | | | | |
|---|---|---|---|---|
| 4,208,547 A | * | 6/1980 | Simeau | 381/10 |
| 4,246,440 A | * | 1/1981 | Van Der Heide et al. | 381/14 |
| 4,481,658 A | * | 11/1984 | Schmidt | 381/14 |
| 4,493,099 A | * | 1/1985 | Schmidt | 381/14 |
| 4,562,591 A | * | 12/1985 | Stikvoort | 381/106 |

(Continued)

FOREIGN PATENT DOCUMENTS

| | | |
|---|---|---|
| CN | 101751925 B | 12/2011 |
| WO | 84/03807 A1 | 9/1984 |
| WO | 2011/114300 A1 | 9/2011 |

OTHER PUBLICATIONS

"An Introduction to Delta-Sigma Converter", retrieved from the Internet at: http://www.beis.de/Elektronik/DeltaSigma/DeltaSigma.html, 10 pgs (Jun. 2008).

(Continued)

*Primary Examiner* — Daniel Washburn
*Assistant Examiner* — Amneet Singh

(57) ABSTRACT

A signal processing method for enhancing the dynamic range of a signal is disclosed. The method comprises:
a) forming an attenuated signal from an input signal;
b) filtering each of the input and the attenuated signals such that the sum of their bandwidths is less than or equal to the bandwidth of a transmission channel;
c) modulating a first one of the filtered input signal and the filtered attenuated signal, whereby the filtered input signal and the filtered attenuated signal occupy respective non-overlapping frequency ranges within the bandwidth of the transmission channel; and
d) combining the modulated signal with the second one of the filtered input signal and the filtered attenuated signal to form a composite output signal.

13 Claims, 2 Drawing Sheets

(56) References Cited

U.S. PATENT DOCUMENTS

| | | | |
|---|---|---|---|
| 4,661,851 A * | 4/1987 | Muterspaugh | 348/485 |
| 4,922,535 A * | 5/1990 | Dolby | 704/500 |
| 5,727,068 A * | 3/1998 | Karagosian et al. | 381/22 |
| 6,005,506 A * | 12/1999 | Bazarjani et al. | 341/143 |
| 6,023,513 A * | 2/2000 | Case | 381/61 |
| 7,092,460 B1 * | 8/2006 | Wildhagen | 375/327 |
| 7,245,893 B1 * | 7/2007 | Husted et al. | 455/226.3 |
| 7,619,551 B1 * | 11/2009 | Wu | 341/143 |
| 7,881,692 B2 * | 2/2011 | Tuttle et al. | 455/333 |
| 7,925,238 B2 * | 4/2011 | Suominen | 455/302 |
| 7,936,293 B2 * | 5/2011 | Hamashita | 341/143 |
| 7,949,419 B2 * | 5/2011 | Kong et al. | 700/94 |
| 8,077,768 B2 * | 12/2011 | Nakano et al. | 375/239 |
| 8,116,705 B2 * | 2/2012 | Suominen | 455/142 |
| 8,140,043 B2 * | 3/2012 | Suominen | 455/302 |
| 2003/0030577 A1 * | 2/2003 | Watanabe | 341/143 |
| 2003/0043932 A1 * | 3/2003 | Breitschadel et al. | 375/296 |
| 2003/0122692 A1 * | 7/2003 | Roeckner et al. | 341/53 |
| 2003/0161486 A1 * | 8/2003 | Wu et al. | 381/94.4 |
| 2003/0220801 A1 * | 11/2003 | Spurrier | 704/503 |
| 2005/0226426 A1 * | 10/2005 | Oomen et al. | 381/23 |
| 2006/0018493 A1 | 1/2006 | Oh et al. | |
| 2006/0147047 A1 * | 7/2006 | Schuijers et al. | 381/23 |
| 2007/0035667 A1 * | 2/2007 | Ying et al. | 348/738 |
| 2007/0189400 A1 * | 8/2007 | Nakano et al. | 375/242 |
| 2007/0242831 A1 * | 10/2007 | Chen et al. | 381/2 |
| 2007/0273563 A1 * | 11/2007 | Wu et al. | 341/61 |
| 2008/0152167 A1 * | 6/2008 | Taenzer | 381/94.2 |
| 2009/0116664 A1 | 5/2009 | Smirnov et al. | |
| 2010/0177902 A1 * | 7/2010 | Wong et al. | 381/3 |
| 2010/0289479 A1 * | 11/2010 | Prance et al. | 324/76.39 |
| 2011/0026739 A1 * | 2/2011 | Thomsen et al. | 381/120 |
| 2011/0029109 A1 * | 2/2011 | Thomsen et al. | 700/94 |
| 2011/0064246 A1 * | 3/2011 | Loeppert et al. | 381/107 |
| 2012/0121106 A1 * | 5/2012 | Henriksen | 381/94.1 |

OTHER PUBLICATIONS

Extended European Search Report for EP Patent Appln. No. 11150750.5 (Jul. 20, 2011).

* cited by examiner

SIGNAL PROCESSING METHOD FOR ENHANCING A DYNAMIC RANGE OF A SIGNAL

CROSS-REFERENCE TO RELATED APPLICATIONS

This application claims the priority under 35 U.S.C. §119 of European patent application no. 11150750.5, filed on Jan. 12, 2011, the contents of which are incorporated by reference herein.

FIELD OF INVENTION

The invention relates to a signal processing method for enhancing the dynamic range of a signal. It also relates to a signal processing method for signal recovery and to signal processors for carrying out the methods.

BACKGROUND

An example of a device that can generate a signal with a high dynamic range is a microphone. These can detect very quiet sounds (such as whispering) through to very loud sounds (such as a concert or an aircraft taking off) without distortion.

In some cases, it can be difficult or impossible to handle this high dynamic range signal. For example, in a mobile phone application, the digital channel coupling the microphone to the baseband circuitry is limited in terms of the dynamic range it can handle. Furthermore, the characteristics of the digital channel are specified by a standard, and so it is impossible to enhance these characteristics. Thus, any attempt to handle a higher dynamic range must be compatible with this digital channel and with existing baseband circuitry.

Existing techniques for improving the dynamic range of a signal make use of signal compression (e.g. companding) techniques or of time varying gain controls (e.g. automatic gain control). However, these affect the linearity of the signal and are incompatible with various signal processing algorithms, such as noise reduction and echo cancellation algorithms.

SUMMARY

According to a first aspect of the invention, there is provided a signal processing method for enhancing the dynamic range of a signal, the method comprising:
a) forming an attenuated signal from an input signal;
b) filtering each of the input and the attenuated signals such that the sum of their bandwidths is less than or equal to the bandwidth of a transmission channel;
c) modulating a first one of the filtered input signal and the filtered attenuated signal, whereby the filtered input signal and the filtered attenuated signal occupy respective non-overlapping frequency ranges within the bandwidth of the transmission channel; and
d) combining the modulated signal with the second one of the filtered input signal and the filtered attenuated signal to form a composite output signal.

Hence, the invention provides a method for bundling the original input signal with an attenuated version of it into the composite output signal for transmission over the same channel. The original input signal may be used for low or mid level signals, whereas the attenuated version may be used for high level signals. Thus, a higher dynamic range is provided by way of the input and attenuated signal at the expense of signal bandwidth.

In a typical application of the method, the input signal is received from a microphone. The input signal may be digital, for example, if it is received from a digital microphone with a pulse density modulation (PDM) output. Such microphones are commonly used in mobile phone applications.

In one embodiment, the attenuated signal is formed from the input signal using a capacitive network. This is particularly useful when the input signal is received from a microphone since these are normally capacitive sensors. However, for other sensors different types of attenuation circuit may be used (for example, a resistive potential divider).

Typically, the capacitive network will comprise a series coupling capacitor for coupling the input signal to signal processing circuitry, and a capacitive voltage divider comprising two capacitors in series between an input node for receiving the input signal and ground. The attenuated signal will be present at the junction between the two capacitors, and their relative values are selected to achieve a desired attenuation.

In one embodiment, the method further comprises, prior to step (b), converting the input signal and the attenuated signal to digital signals. The digital signals may be pulse density modulated (PDM) single bit bitstreams, in which case conversion is typically done with a sigma-delta analogue-to-digital converter. Alternatively, the digital signals may be pulse code modulated (PCM) digital signals having widths of n bits, where n id greater than or equal to 2. This conversion to PCM digital signals may be done directly, or by conversion to PDM (using, for example, a sigma-delta analogue-to-digital converter) followed by conversion to PCM using a 1-bit to N-bit converter (which generates the PCM signal from the PDM signal).

Typically, the method further comprises, prior to step (c), decimating the first one of the filtered input signal and the filtered attenuated signal.

In another embodiment, step (b) is performed in the analogue domain.

In this embodiment, the filtered input signal and filtered attenuated signal may be converted to pulse density modulated (PDM) single bit bitstreams. This conversion is typically done with a sigma-delta analogue-to-digital converter. Alternatively, the filtered input signal and filtered attenuated signal may be converted to pulse code modulated (PCM) digital signals having widths of n bits, where n is greater than or equal to 2. This conversion to PCM digital signals may be done directly, or by conversion to PDM (using, for example, a sigma-delta analogue-to-digital converter) followed by conversion to PCM using a 1-bit to N-bit converter (which generates the PCM signal from the PDM signal).

The modulation of step (c) may be performed by multiplying the first one of the filtered input signal and the filtered attenuated signal with a digital signal of width n bits synthesised to approximate a sine wave of frequency n times the sampling frequency of the digital filtered input signal and digital filtered attenuated signal.

Preferably, the method further comprises the following step:
e) converting the combined signal of step (d) into a single bit bitstream.

In accordance with a second aspect of the invention, there is provided a signal processing method for recovering an input signal and attenuated signal from a composite output signal generated in accordance with the method of the first aspect of the invention, the method comprising recovering the input signal using a low-pass filter and recovering the attenuated signal by demodulating the composite output signal and then using a low-pass filter.

Typically, the low-pass filters will have cut-off frequencies of a quarter of the sampling frequency of the composite output signal and the demodulation will be performed by multiplying the composite output signal with a sine wave having a frequency of a half of the sampling frequency.

This method preferably further comprises a multiplexer configured to select the recovered input signal, the recovered attenuated signal or a mixture of them depending on the amplitude of the recovered input and/or attenuated signals.

In accordance with a third aspect of the invention, there is provided a signal processing method for recovering an input signal from a composite output signal generated in accordance with the first aspect of the invention, the method comprising recovering the input signal using a low-pass filter.

When the composite input signal is converted into a single bit bitstream, the methods of the second and third aspects may further comprise decimating the composite input signal prior to recovering the input signal and the attenuated signal.

BRIEF DESCRIPTION OF THE DRAWINGS

Examples of the invention will now be described in detail with reference to the accompanying drawings, in which.

DETAILED DESCRIPTION

Figure 1:
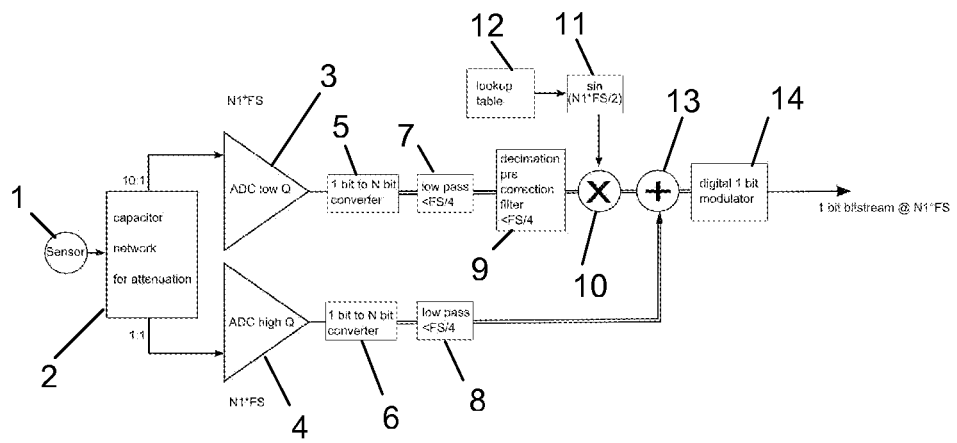
FIG. 1 shows a circuit for processing an input signal to enhance its dynamic range.

FIG. 1 shows a block diagram of a circuit for processing an input signal from a sensor 1, such as a microphone, to enhance its dynamic range. The sensor 1 is coupled to a capacitor network 2, which provides AC coupling between the sensor 1 and two respective analogue-to-digital converters (ADCs) 3, 4. The capacitor network 2 attenuates the signal supplied to ADC 3 by a factor of 10 (i.e. 20 dB), whereas the signal supplied to ADC 4 is not attenuated. Other attenuation factors than 10 may be used to suit particular circumstances. To obtain an attenuation factor of 10, a pair of capacitors placed in series with values in the ratio of 1:9 can be placed in series between the input signal and ground, the lower value capacitor being connected to the input signal and the higher value capacitor being connected to ground. The attenuated signal is then available at their junction.

Each of the ADCs 3, 4 is a sigma-delta converter, which produces a pulse density modulated (PDM) bitstream. Each ADC 3, 4 operates at a sampling frequency of $f_s$ and oversamples the signals by a factor of $N_1$. Low amplitude signals are handled by ADC 4 and the associated signal path. However, ADC 4 will be overloaded by high amplitude signals, which are instead handled (as attenuated versions of the high amplitude signals) by ADC 3 and the associated signal path. The ADC 3 should preferably be selected so that it can handle signal amplitudes in between the overloading point of ADC 4 and the sum of this overloading point and the attenuation factor of the capacitor network.

ADC 4 requires a fairly high signal-to-noise ratio (SNR). The required value is calculated from the ratio of nominal sensor output level (in the case of a microphone, typically the sensitivity at a sound pressure level of 1 Pa) and the noise floor. ADC 3, on the other hand, needs only to handle higher amplitude signals and can have a much lower SNR, which results in lower power consumption.

Each ADC 3, 4 is coupled to a respective 1-bit to N-bit converter 5, 6. These convert the single bit PDM bitstream to an N-bit pulse code modulation (PCM) format. This is done to make the following signal processing steps (such as addition, filtering and modulation) easier to perform.

Each 1-bit to N-bit converter 5, 6 is coupled to a respective low-pass filter 7, 8. These limit the bandwidth of the signals to less than a quarter of $f_s$ so that the signal can later be recovered without significant crosstalk between the two channels (i.e. between the high amplitude signals processed by ADC 3 and the low amplitude signals processed by ADC 4). In designing the low-pass filters 7, 8 a trade-off between stopband attenuation and passband ripple group delay has to be made.

The low-pass filter 7 is coupled to a decimation pre-correction filter 9. The decimation pre-correction filter 9 is not required where the low-pass filter 7 is a fourth order filter. However, for other filter orders, the decimation pre-correction filter 9 ensures that after demodulation in the signal recovery process, the signal is not distorted.

The signal from the decimation pre-correction filter 9 is then amplitude modulated in a modulator 10 with a modulating signal at a frequency of $$N_1 \cdot \frac{f_s}{2}.$$

The modulating signal is generated by a direct digital synthesiser 11 that retrieves values of $$\sin\left(N_1 \cdot \frac{f_s}{2}\right)$$

from a lookup table 12.

This modulation step has the effect of producing a double sideband signal centered around a frequency of $$\frac{f_s}{2}.$$

Thus, the low amplitude signals processed by ADC 4 and the associated signal path occupy frequencies up to $$\frac{f_s}{4},$$

and the high amplitude signals processed by ADC 3 and the associated signal path occupy frequencies between $$\frac{f_s}{4} \text{ and } \frac{f_s}{2}.$$

The modulated signal from modulator 10 is then added in adder 13 to the signal from low-pass filter 8 to generate a composite signal of both the low amplitude signals processed by ADC 4 and the associated signal path and the high amplitude signals processed by ADC 3 and the associated signal path. The composite signal is then converted to a single bit bitstream in 1-bit modulator 14.

Figure 2:
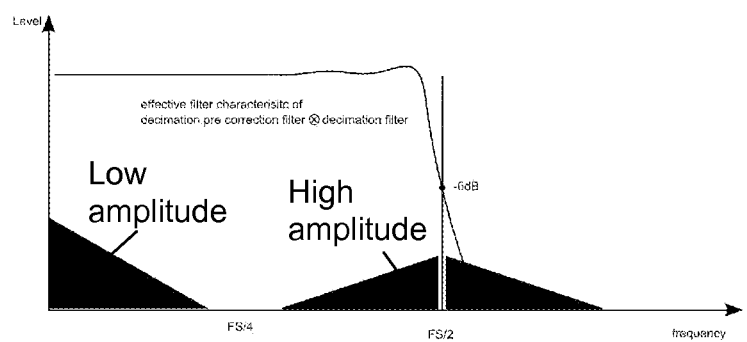
FIG. 2 shows the frequency spectrum of the composite signal generated by the circuit of FIG. 1.

The signal spectrum of this composite signal is shown in FIG. 2, which also shows the effective filter characteristic of the signal path from ADC 3 through to decimation pre-correction filter 9.

Figure 3:
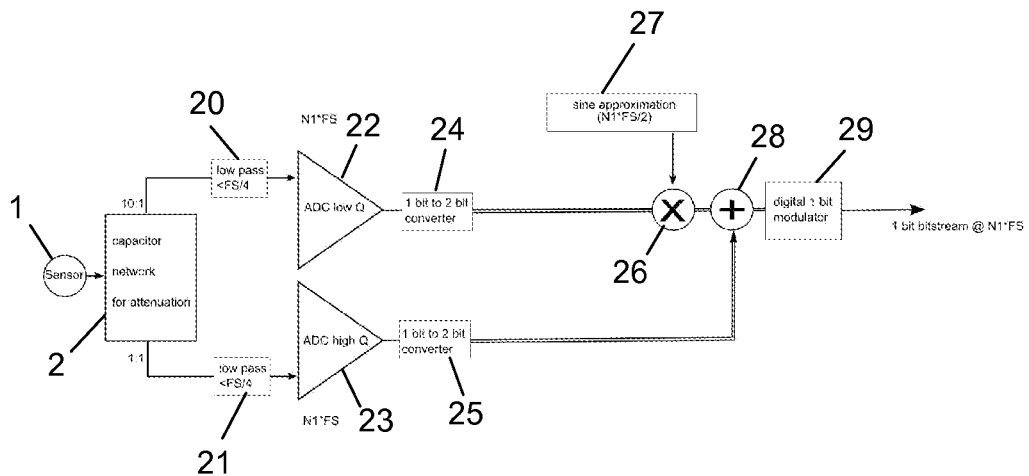
FIG. 3 shows another circuit for processing an input signal to enhance its dynamic range.

The implementation described above with reference to FIG. 1 is entirely digital from the ADCs 3, 4 onwards. Typically, this would be implemented on a digital signal processor. It is possible to simplify the digital processing by carrying out the low-pass filtering function in the analogue domain. Such an implementation is shown in FIG. 3. This simpler implementation is made at the expense of more noise, which is not suppressed due to the lack of the digital low-pass filters of the FIG. 1 implementation.

In this implementation, a pair of analogue low-pass filters 20, 21 receive the signals from the capacitor network. Low-pass filter 20 receives the attenuated signal, and low-pass filter 21 receives the non-attenuated signal. Both filters 20, 21 have a cut-off frequency at $$\frac{f_s}{4}.$$

The filters 20, 21 are coupled to respective ADCs 22, 23. These are the same as the ADCs 3, 4 described above with respect to FIG. 1, and the same considerations apply. The ADCs 22, 23 oversample with an oversampling factor of $N_1$.

Each ADC 22, 23 is coupled to a respective 1-bit to 2-bit converter 24, 25. These convert the PDM bitstream received from ADCs 22, 23 to 2-bit PDM signals. This is the minimum number of bits required to be able to add two PDM signals together.

The signal from 1-bit to 2-bit converter 24 is then modulated by modulator 26 using a modulating signal generated by direct digital synthesiser 27. Direct digital synthesiser 27 generates a sine wave with frequency $N \cdot f_s/2$ and a width of 2 bits.

The 2-bit modulated signal from modulator 26 is added to the low amplitude signals from 1-bit to 2-bit converter 25 in adder 28. The resulting composite signal is then converted to a single bit PDM bitstream by digital 1-bit modulator 29. The composite signal has a spectrum as shown in FIG. 1.

In this implementation, there is no decimation pre-correction filter because this may be implemented in the signal processor which handles signal recovery.

Figure 4:
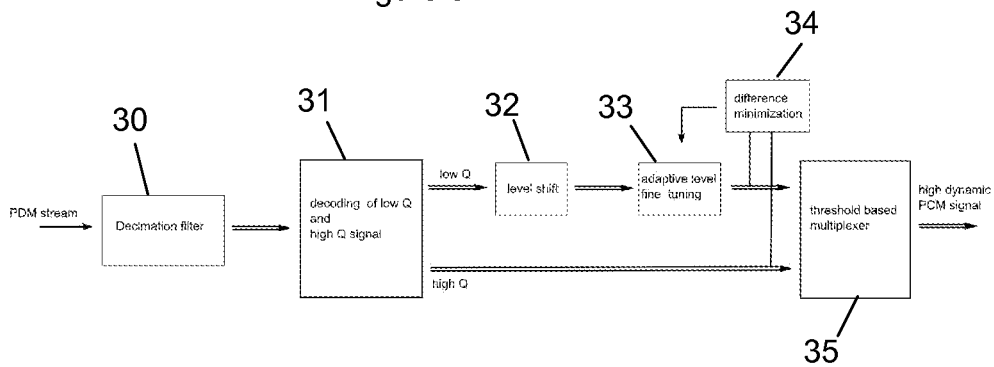
FIG. 4 shows a circuit for recovering the input signal and attenuated signal from a composite signal generated by the circuit of FIG. 1 or FIG. 3.

FIG. 4 shows a circuit for recovering the attenuated and non-attenuated signals from the composite signals generated by FIGS. 1 and 3. In FIG. 4, a decimation filter 30 decimates and downsamples the composite signal. The decimation filter 30 converts the PDM single bit bitstream to a multi-bit PCM signal with a bandwidth of half the sampling frequency, $$\frac{f_s}{2}.$$

This results in a PCM signal, which is supplied to a decoder 31. This recovers the attenuated signal and the non-attenuated signal from the composite signal. To recover the non-attenuated signal, the decoder 31 simply passes it through a low-pass filter with a cut-off frequency of $$\frac{f_s}{4}.$$

To recover the attenuated signal, the decoder 31 demodulates the input signal by multiplying it by a sine wave with a frequency of $$\frac{f_s}{2}$$

and then passes the demodulated signal through a low-pass filter with a cut-off frequency of $$\frac{f_s}{4}.$$

This process is similar to the FM MPX decoding technique. However, whereas in a standard MPX process the transmission of a pilot tone is required, in this case this is not required. Instead, a simple clock counter can be used to restore the signals from the system clock running at $N \cdot f_s$.

The attenuated signal is then amplified by a factor of 10 (to match the attenuation factor introduced by the capacitor network 2) by level shifter 32. This results in two signals with similar amplitudes: the attenuated signal (now amplified), which is noisy for low and mid-amplitude signals, but linear for high amplitude signals; and the non-attenuated signal, which is linear for low and mid-amplitude signals, but distorted for high amplitude signals.

To allow the signals to be properly combined, an adaptive fine tuning circuit 33 is used, which adjusts the signal level of the (now amplified) attenuated signal to minimise the difference between it and the non-attenuated signal. This difference is monitored by a difference minimisation circuit 34.

A threshold based multiplexer 35 is used to select the non-attenuated signal for low or mid-amplitude signal levels or the attenuated (and now amplified and fine tuned) signal for high amplitude signal levels. In the overlap between these two, a mixture of the two signals is used to produce the output signal.

This multiplexer 35 monitors the sample value of each sample of the non-attenuated signal. Depending on this sample value, the non-attenuated, attenuated or mixed signal is selected as the output of the multiplexer 35. When the sample value is below a first threshold the non-attenuated signal is selected. When the sample value is equal to or greater than the first threshold but below a second threshold the mixed signal is selected, and when the sample value is greater than or equal to the second threshold the attenuated signal is selected. The mixed signal is generated by multiplying each of the attenuated and non-attenuated signals by respective weighting coefficients and then adding the resultant weighted signals together.

Figure 5:
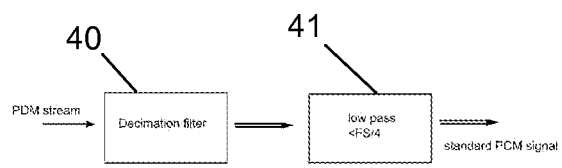
FIG. 5 shows a circuit for recovering the input signal from a composite signal generated by the circuit of FIG. 1 or FIG. 3.

FIG. 5 shows a way in which only the non-attenuated signal may be recovered. This is simply a decimation filter 40 coupled to a low-pass filter 41 with a cut-off frequency of $$\frac{f_s}{4}.$$

This effectively just filters out the modulated, attenuated signal from the composite signal, leaving only the attenuated signal. If the decimation filter is programmable, the filter coefficients may be programmed to incorporate the low-pass filter characteristic into the decimation filter 40.

The above examples have all made use of filter cut-off frequencies of $$\frac{f_s}{4}.$$

This is not a required value. It is possible to use more of the available bandwidth of $$\frac{f_s}{2}$$

for the non-attenuated signal than for the attenuated signal.

The dynamic range of the augmented signal is defined by the capacitor network and can therefore be chosen as a trade-off with respect to implementation costs (determined, for example, by the accuracy of the sine approximation of the modulator) and current consumption (determined, for example, by SNR of ADC 3 or 22).

In contrast to other dynamics augmenting solutions (such as compression or time variant gain control), a linear signal covering the whole dynamic range is received which is therefore compatible with algorithms such as echo or noise cancellation.

In many cases (such as in telephony applications) the full audio bandwidth is not required. Therefore, the bandwidth reduction that occurs with this invention is often not a problem.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A signal processing method for enhancing a dynamic range of a signal, the method comprising:
   a) forming an attenuated signal from an input signal;
   b) filtering each of the input and the attenuated signals such that a sum of their bandwidths is not more than a bandwidth of a transmission channel;
   prior to step (b), converting the input signal and the attenuated signal to digital signals;
   c) modulating a first one of the filtered input signal and the filtered attenuated signal, whereby the filtered input signal and the filtered attenuated signal occupy respective non-overlapping frequency ranges within the bandwidth of the transmission channel, wherein the modulation of step (c) is performed by multiplying the first one of the filtered input signal and the filtered attenuated signal with a digital signal having a width of a plurality of bits synthesised to approximate a sine wave with a frequency of half a sampling frequency of the digital filtered input signal and digital filtered attenuated signal; and
   d) combining the modulated signal with the second one of the filtered input signal and the filtered attenuated signal to form a composite output signal.

2. A method according to claim 1, wherein the attenuated signal is formed from the input signal using a capacitive network.

3. A method according to claim 1, wherein the digital signals are pulse density modulated single bit bitstreams.

4. A method according to claim 1, wherein the digital signals are pulse code modulated digital signals having widths of n bits, where n is not less than 2.

5. A method according to claim 1, further comprising, prior to step (c), decimating the first one of the filtered input signal and the filtered attenuated signal.

6. A method according to claim 1, wherein step (b) is performed in the analogue domain.

7. A method according to claim 6, wherein the filtered input signal and filtered attenuated signal are converted to pulse density modulated single bit bitstreams.

8. A method according to claim 6, wherein the filtered input signal and filtered attenuated signal are converted to pulse code modulated digital signals having widths of n bits, where n is not less than 2.

9. A method according to claim 1, further comprising the step of:
   e) converting the combined signal of step (d) into a single bit bitstream.

10. A signal processing method for recovering an input signal and attenuated signal from a composite output signal generated in accordance with the method of claim 1, the method comprising recovering the input signal using a low-pass filter and recovering the attenuated signal by demodulating the composite output signal and then using a low-pass filter.

11. A method according to claim 10, further comprising a multiplexer configured to select at least one of the recovered input signal, and the recovered attenuated signal, depending on the amplitude of the recovered input and/or attenuated signals.

12. A signal processing method for recovering an input signal from a composite output signal generated in accordance with the method of claim 1, the method comprising recovering the input signal using a low-pass filter.

13. A method according to claim 10, further comprising decimating the composite input signal prior to recovering the input signal and the attenuated signal.

* * * * *